US012249992B2

United States Patent
Tian et al.

(10) Patent No.: US 12,249,992 B2
(45) Date of Patent: Mar. 11, 2025

(54) D FLIP-FLOP, PROCESSOR INCLUDING THE D FLIP-FLOP, AND COMPUTING APPARATUS

(71) Applicant: SHENZHEN MICROBT ELECTRONICS TECHNOLOGY CO., LTD., Guangdong (CN)

(72) Inventors: Wenbo Tian, Guangdong (CN); Chuan Gong, Guangdong (CN); Zhijun Fan, Guangdong (CN); Zuoxing Yang, Guangdong (CN); Haifeng Guo, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/038,774

(22) PCT Filed: Mar. 6, 2023

(86) PCT No.: PCT/CN2023/079832
§ 371 (c)(1),
(2) Date: May 25, 2023

(87) PCT Pub. No.: WO2023/207339
PCT Pub. Date: Nov. 2, 2023

(65) Prior Publication Data
US 2024/0364316 A1    Oct. 31, 2024

(30) Foreign Application Priority Data
Apr. 28, 2022 (CN) .......................... 202210455795.X

(51) Int. Cl.
H03K 3/037 (2006.01)
H03K 3/012 (2006.01)

(52) U.S. Cl.
CPC ............. *H03K 3/037* (2013.01); *H03K 3/012* (2013.01)

(58) Field of Classification Search
CPC .......... H03K 3/037; H03K 3/012; H03K 5/05; H03K 5/135; H03K 19/094; H03K 19/0941; H03K 19/0944; G11C 7/065
See application file for complete search history.

(56) References Cited

U.S. PATENT DOCUMENTS

| 5,883,529 A | 3/1999 | Kumata et al. |
| 7,109,772 B2 | 9/2006 | Tohsche |

(Continued)

FOREIGN PATENT DOCUMENTS

| CN | 1992519 A | 7/2007 |
| CN | 102427296 A | 4/2012 |

(Continued)

OTHER PUBLICATIONS

Notification to Grant Patent Right for Invention of the priority CN application No. 202210455795.X and English translation (8 pages).

(Continued)

*Primary Examiner* — Jung Kim
(74) *Attorney, Agent, or Firm* — Merchant & Gould P.C.

(57) ABSTRACT

A D flip-flop, a processor including the D flip-flop, and a computing apparatus. A D flip-flop is provided, including: an input stage configured to receive a flip-flop input; an output stage configured to output a flip-flop output; an intermediate node disposed between an output of the input stage and an input of the output stage, where the output stage is configured to receive a signal at the intermediate node as an input; an intermediate stage configured to receive the output of the input stage and provide the output to the intermediate node; and a feedback stage configured to receive the flip-flop output and provide a feedback to the intermediate node, (Continued)

where the feedback stage assumes a logic-high state, a logic-low state, and a high-impedance state.

19 Claims, 6 Drawing Sheets

(56) References Cited

U.S. PATENT DOCUMENTS

| | | | |
|---|---|---|---|
| 9,148,149 B2* | 9/2015 | Cheng | H03K 19/09429 |
| 10,031,723 B1* | 7/2018 | Takahashi | G06F 7/588 |
| 10,992,289 B2* | 4/2021 | Wu | H03K 3/35625 |
| 2017/0237414 A1 | 8/2017 | Kim et al. | |
| 2022/0224316 A1 | 7/2022 | Agarwal et al. | |
| 2023/0238947 A1 | 7/2023 | Tian et al. | |

FOREIGN PATENT DOCUMENTS

| | | |
|---|---|---|
| CN | 104079290 A | 10/2014 |
| CN | 110635783 A | 12/2019 |
| CN | 111600577 A | 8/2020 |
| CN | 213879787 U | 8/2021 |
| CN | 214154471 U | 9/2021 |
| CN | 114567297 A | 5/2022 |
| JP | S61134122 A | 6/1986 |
| JP | 2011023941 A | 2/2011 |
| JP | 2021-100237 A | 7/2021 |
| KR | 2016-0069323 A | 6/2016 |
| KR | 2021-0039337 A | 4/2021 |
| TW | 202002516 A | 1/2020 |
| TW | 202135467 A | 9/2021 |
| WO | 2019236224 A | 12/2019 |

OTHER PUBLICATIONS

International Search Report and Written Opinion for PCT/CN2023/079832 mailed on Apr. 21, 2023 (8 pages.
English Translation of International Search Report and Written Opinion for PCT/CN2023/079832 mailed on Apr. 21, 2023 (8 pages).
First Chinese Office Action for Application No. 202210455795.X dated Jun. 10, 2022 (17 pages with English Translation).
Second Chinese Office Action for Application No. 202210455795.X dated Jul. 7, 2022 (17 pages with English Translation).
Third Chinese Office Action for Application No. 202210455795.X dated Jul. 29, 2022 (16 pages with English Translation).
Rejection Decision for CN Application No. 202210455795.X dated Jan. 13, 2023 (15 pages with English Translation).
Reexamination Decision for CN Application No. 202210455795.X dated Mar. 8, 2023 (2 pages with English Translation).
First Office Action for corresponding Taiwanese application 112108143 dated Oct. 6, 2023 (13 pages including machine translation).
Search Report for corresponding Taiwanese application 112108143 (1 page).
First Office Action issued on Sep. 23, 2024 for corresponding KR Application No. 10-2023-7021112 (16 pages including English Translation).

* cited by examiner

D FLIP-FLOP, PROCESSOR INCLUDING THE D FLIP-FLOP, AND COMPUTING APPARATUS

CROSS-REFERENCE TO RELATED APPLICATIONS

This application is a National Stage Application of International Application No. PCT/CN2023/079832, filed 6 Mar. 2023, which claims benefit of Serial Number 202210455795.X, filed 28 Apr. 2022 in China, and which applications are incorporated herein by reference. To the extent appropriate, a claim of priority is made to each of the above disclosed applications.

TECHNICAL FIELD

The present disclosure relates to a D flip-flop, a processor including the D flip-flop, and a computing apparatus.

BACKGROUND

In recent years, digital currency has attracted more and more attention. In a related art, a processor and a computing apparatus for digital currency need to be improved.

The processor for digital currency needs to perform a large amount of repetitive logical calculations during operation, requiring a large number of D flip-flops for data storage. Therefore, the performance of the D flip-flops directly affects the performance of the processor, including the chip's area, power consumption, operational speed, etc.

SUMMARY

According to an aspect of the present disclosure, a D flip-flop is provided which includes: an input stage configured to receive a flip-flop input: an output stage configured to output a flip-flop output: an intermediate node disposed between an output of the input stage and an input of the output stage, wherein the output stage is configured to receive a signal at the intermediate node as an input: an intermediate stage configured to receive an output of the input stage and provide the output to the intermediate node: and a feedback stage configured to receive the flip-flop output and provide a feedback to the intermediate node, wherein the feedback stage assumes a logic-high state, a logic-low state, and a high-impedance state.

In some embodiments, the feedback stage comprises a tri-state gate that comprises: first to fourth transistors that are sequentially connected in series, wherein the first transistor and the second transistor are transistors of a first conductivity type, the third transistor and the fourth transistor are transistors of a second conductivity type that is different from the first conductivity type, a control terminal of one of the first transistor and the second transistor is configured to be connected to the flip-flop output, a control terminal of the other of the first transistor and the second transistor is configured to be connected to a first clock signal, a control terminal of one of the third transistor and the fourth transistor is configured to be connected to the flip-flop output, a control terminal of the other of the third transistor and the fourth transistor is configured to be connected to a second clock signal, wherein the second clock signal is an inverse of the first clock signal, a node at which the second transistor and the third transistor are connected with each other is configured to be connected to the intermediate node.

In some embodiments, the feedback stage comprises an inverter and a transmission gate connected in series, the inverter comprises a first transistor of a first conductivity type and a fourth transistor of a second conductivity type that are connected in series, the transmission gate comprises a second transistor of the first conductivity type and a third transistor of the second conductivity type that are connected in parallel, the second conductivity type is different from the first conductivity type, an input of the inverter is configured to be connected to the flip-flop output, an output of the inverter is configured to be connected to an input of the transmission gate, an output of the transmission gate is configured to be connected to the intermediate node, two control terminals of the transmission gate are configured to receive a first clock signal and a second clock signal respectively, wherein the second clock signal is an inverse of the first clock signal.

In some embodiments, the first conductivity type is P-type, the second conductivity type is N-type, when the first clock signal is high and the second clock signal is low; the feedback stage is configured to be turned off to assume the high-impedance state: when the first clock signal is low and the second clock signal is high, the feedback stage is configured to provide a feedback to the intermediate node based on the flip-flop output.

In some embodiments, the input stage comprises a transmission gate. In some embodiments, the intermediate stage is a tri-state logic configured to receive the output of the input stage as well as the first clock signal and the second clock signal, the tri-state logic is configured to assume the logic-high state, the logic-low state, and the high-impedance state based on the input, the first clock signal, and the second clock signal.

In some embodiments, the tri-state logic comprises an inverter and a transmission gate, the inverter is configured to receive the output of the input stage as an input, an output of the inverter is configured to be connected to one end of the transmission gate, another end of the transmission gate is configured to be connected to the intermediate node, control terminals of the transmission gate are configured to receive the first clock signal and the second clock signal respectively.

In some embodiments, the tri-state logic comprises a tri-state gate that comprises: fifth to eighth transistors that are sequentially connected in series, wherein the fifth transistor and the sixth transistor are transistors of the first conductivity type, and the seventh transistor and the eighth transistor are transistors of the second conductivity type, a control terminal of one of the fifth transistor and the sixth transistor is configured to be connected to the output of the input stage, a control terminal of the other of the fifth transistor and the sixth transistor is configured to be connected to the second clock signal, a control terminal of one of the seventh transistor and the eighth transistor is configured to be connected to the output of the input stage, a control terminal of the other of the seventh transistor and the eighth transistor is configured to be connected to the first clock signal, a node at which the sixth transistor and the seventh transistor are connected with each other is configured to be connected to the intermediate node.

In some embodiments, the D flip-flop is a semi-static flip-flop, and the output stage, the feedback stage, and the intermediate node constitute a latch.

In some embodiments, the first conductivity type is P-type, the second conductivity type is N-type, when the first clock signal is high and the second clock signal is low; the first intermediate stage is configured to provide an output to the intermediate node based on the output of the input stage: when the first clock signal is low and the second clock signal is high, the first intermediate stage is configured to be turned off to assume a high-impedance state.

In some embodiments, logic toggling of an output of at least one of the input stage or the intermediate stage is triggered by an edge of a clock signal. In some embodiments, thresholds of transistors in the D flip-flop are basically identical.

According to an aspect of the present disclosure, a processor is further provided which includes at least one D flip-flop, wherein the D flip-flop is the D flip-flop according to any embodiment of the present disclosure.

In some embodiments, the at least one D flip-flop comprises a plurality of D flip-flops; and the processor further comprises: a clock circuit configured to provide a desired clock signal to each of the plurality of D flip-flops.

In some embodiments, the clock circuit comprises a first inverter and a second inverter connected in series, the first inverter is configured to receive a clock signal and output a first clock signal, the second inverter is configured to receive the first clock signal and output a second clock signal, the first clock signal and the second clock signal are provided to each of the plurality of D flip-flops.

According to an aspect of the present disclosure, a computing apparatus is further provided which includes the processor according to any embodiment of the present disclosure.

In some embodiments, the computing apparatus is a computing apparatus for digital currency.

Other features and advantages of the present disclosure will become apparent from the following detailed description of exemplary embodiments of the present disclosure with reference to the accompanying drawings.

BRIEF DESCRIPTION OF DRAWINGS

The drawings as a part of the specification illustrate embodiments of the present disclosure and are used together with the specification to interpret the principles of the present disclosure.

The present disclosure can be more clearly understood from the following detailed description with reference to the drawings, in which.

Figure 1:
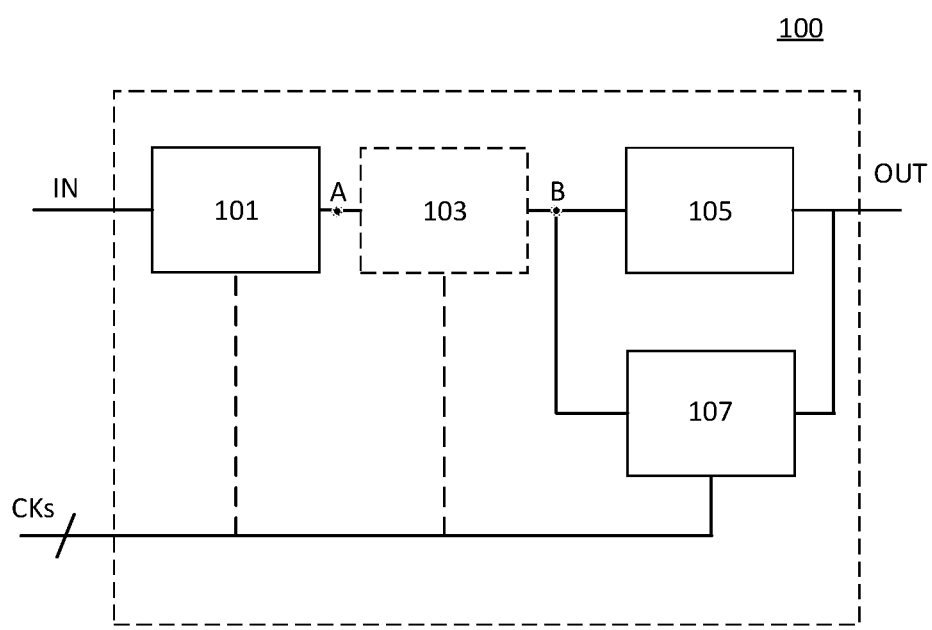
FIG. 1 shows a schematic block diagram of a D flip-flop according to some embodiments of the present disclosure.

It is hereby noted that in the embodiments described below; the same reference numerals are sometimes used between different drawings to denote the same parts or the parts of the same functions, and repeated description thereof is omitted. In this specification, similar reference numerals and letters are used to represent similar items. Therefore, once an item is defined in one drawing, the item does not need to be further discussed in subsequent drawings.

For ease of understanding, the position, dimensions, range, and the like of each structure shown in the drawings and the like sometimes do not represent the actual position, dimensions, range, and the like. Therefore, the disclosed invention is not limited to the positions, dimensions, ranges, and the like disclosed in the drawings and the like.

DETAILED DESCRIPTION

Various exemplary embodiments of the present disclosure will now be described in detail with reference to the drawings. It is hereby noted that, unless otherwise specifically specified, the relative arrangement of parts and steps, numerical expressions, and numerical values set forth in these embodiments do not limit the scope of the present disclosure. In addition, the technologies, methods, and devices known to a person of ordinary skill in the related art may be described without going into details, but as appropriate, such technologies, methods, and devices are regarded as a part of the granted specification.

It should be understood that the following description of at least one exemplary embodiment is merely illustrative, and is in no way intended as a limitation on the present disclosure and the application or the use thereof. Further, it should also be understood that any implementation described exemplarily herein is not necessarily meant to be preferred or advantageous over other implementations. The present disclosure is not limited by any expressly stated or implied theory described in the preceding technical field, background, summary, or detailed description.

In this specification, "tri-state logic" means a logic circuit of which an output assumes three states: a logic-high state, a logic-low state, and a high-impedance state, depending on the input and the control signal. The control signal may be, for example, a clock signal.

In this specification, "tri-state gate" means a "minimum-level" logic gate (or referred to as a logic gate circuit) of which an output can implement the three states (logic-high state, logic-low state, and high-impedance state). The "minimum-level logic gate" herein means no independent logic gate or logic unit as a part of the logic gate (tri-state gate) can be separated therefrom.

In addition, for reference purposes only, some terms may be used in the following description without being hereby intended as a limitation. For example, unless otherwise expressly specified in the context, the terms "first", "second", and other such numerical terms referring to structures or elements do not imply a sequence or order.

It should also be understood that the terms "include" and "comprise" when used herein mean existence of the feature, entirety, step, operation, unit and/or component indicated, but do not preclude the existence or addition of one or more other features, entireties, steps, operations, units, and/or components, and/or combinations thereof.

Compared with a static D flip-flop, a dynamic D flip-flop removes a positive feedback circuit used to maintain the working state, and thus has a significantly simplified circuit structure, thereby not only reducing the area of the chip, but also reducing the power consumption of the chip. However, because there is a node that has a floating potential part of the time in the dynamic D flip-flop, a parasitic capacitance at the node needs to maintain a correct voltage state during such period of time.

To reduce or avoid the impact caused by device current leakage to the voltage of the node, a circuit device connected to the node needs to be a low-current-leakage device. The low-current-leakage device is usually a high-threshold device, and is of a lower speed than a low-threshold device, thereby also influencing the speed of the D flip-flop. In addition, the D flip-flop needs to work at a relatively high frequency to prevent malfunction. In some states (for example, sleep or idle state) of a processor, the D flip-flop may work at a relatively low frequency, and in this case, the D flip-flop in the related art may incur malfunction.

To solve one or more of the problems described above, the present disclosure provides a semi-static D flip-flop, a processor including the D flip-flop, and a computing apparatus.

In contrast to the conventional static D flip-flop, the semi-static D flip-flop provided by the present disclosure changes a master register to a dynamic register, thereby reducing area and power consumption while maintaining the same speed. In contrast to the dynamic D flip-flop, the semi-static D flip-flop provided by the present disclosure change a slave register to a static register by adding a stage of tri-state gate feedback at the slave register, thereby being able to work at a relatively low working frequency. In addition, the speed of the D flip-flop is increased by using some low-threshold devices.

The D flip-flop according to embodiments of the present disclosure can stably maintain the potential of the floating node, and reduce power consumption of the D flip-flop. The D flip-flop according to embodiments of the present disclosure can work both at a relatively low frequency and at a relatively high frequency, thereby providing flexibility for design of a processor and reducing power consumption.

The processor and the computing apparatus according to the present disclosure are applicable to related calculations of digital currency (for example, Bitcoin, Litecoin, Ethereum, and other digital currencies).

FIG. 1 is a schematic block diagram of a D flip-flop according to some embodiments of the present disclosure. As shown in FIG. 1, a D flip-flop 100 according to an embodiment of the present disclosure includes an input stage 101 configured to receive an input (IN), and an output stage 105 configured to output a flip-flop output (OUT).

The D flip-flop 100 further includes an intermediate node (B) that is disposed between an output of the input stage and an input of the output stage. During operation, the potential of the intermediate node B is floating in a part of a clock cycle.

In some embodiments, as shown in FIG. 1, an intermediate stage (for example, 103) may exist between the intermediate node B and the input stage.

The input of the output stage 105 receives a signal according to the potential of the intermediate node. For example, in the embodiment shown in FIG. 1, the input of the output stage 105 is directly connected to the intermediate node B.

The D flip-flop 100 further includes a feedback stage 107 that receives the flip-flop output OUT and provide a feedback to the intermediate node. According to an embodiment of the present disclosure, the feedback stage 107 assumes a logic-high state, a logic-low state, and a high-impedance state.

In addition, one or more of components of the D flip-flop 100 may receive a corresponding clock signal. As shown in FIG. 1, the input stage 101, the intermediate stage 103, and the feedback stage 107 each receive a corresponding clock. It should be understood herein that the clock CKs is merely exemplary and does not mean that the input stage 101, the intermediate stage 103, the feedback stage 107, and other components all receive the same clock signal. Further, although in the embodiment shown in FIG. 1, the output stage 105 is shown as not receiving the clock signal, the present disclosure is not limited to this.

Figure 2:
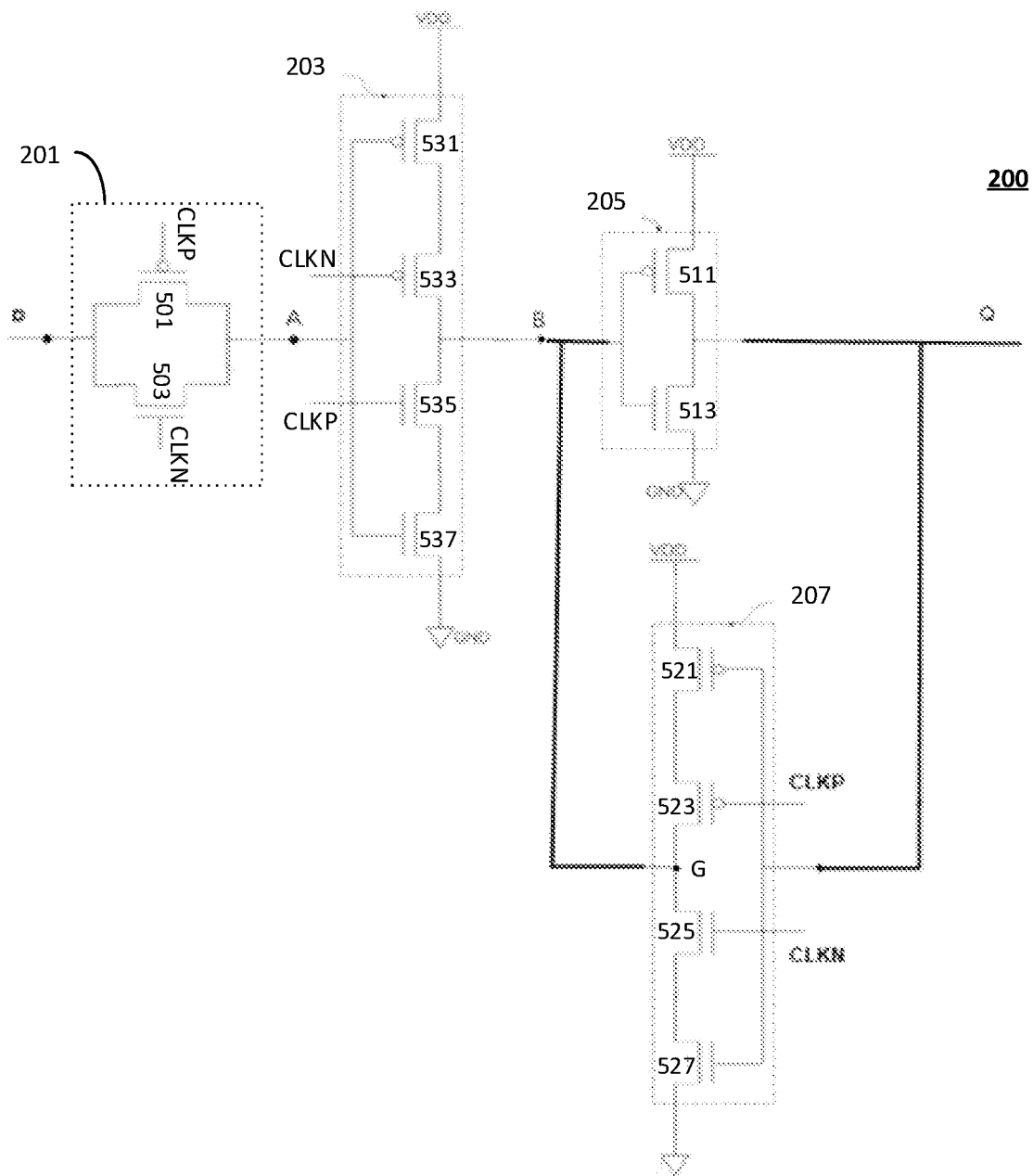
FIG. 2 shows a circuit diagram of a D flip-flop according to some embodiments of the present disclosure.

FIG. 2 is a circuit diagram of a D flip-flop according to some embodiments of the present disclosure. As shown in FIG. 2, a D flip-flop 200 according to an embodiment of the present disclosure includes an input stage 201, an output stage 205, an intermediate node B, and a feedback stage 207. The intermediate node B is disposed between an output of the input stage and an input of the output stage. During a part of time of the operation, the potential at the intermediate node B is floating. The D flip-flop 200 further includes an intermediate stage 203 between the intermediate node B and the input stage 201.

The input stage 201 receives an input D and provides an output to the input of the intermediate stage 203 (through a node A). The node A is disposed between the input stage 201 and the intermediate stage 203. Herein, the input stage 201 is implemented as a transmission gate that includes CMOS (Complementary Metal Oxide Semiconductor) transistors 501 and 503. A PMOS (P Metal Oxide Semiconductor) transistor 501 and an NMOS (N Metal Oxide Semiconductor) transistor 503 receive clock signals CLKP and CLKN respectively. The clock signals CLKP and CLKN are a pair of clock signals of the same frequency but opposite phases. In other words, the clock signal CLKP is the inverse of the clock signal CLKN.

The intermediate stage 203 is connected between the node A and the intermediate node B. and receives voltage at the node A as an input and provides an output to the node B. The intermediate stage 203 further receives the clock signals CLKP and CLKN. For example, the intermediate stage 203 is implemented as a tri-state logic, and assumes a logic-high state, a logic-low state, and a high-impedance state depending on the input D as well as the first clock signal (CLKP or CLKN) and the second clock signal (CLKN or CLKP).

In an embodiment, as shown in FIG. 2, the intermediate stage 203 is implemented as a CMOS tri-state gate that includes four transistors. The CMOS tri-state gate includes: transistors 531, 533, 535, and 537 sequentially connected in series, wherein the transistors 531 and 533 are PMOS transistors, and the transistors 535 and 537 are NMOS transistors.

The transistors 531 and 533 are connected in series with each other. One end (here, a source) of the transistor 533 is connected to one end (here, a drain) of the transistor 531. A control terminal (a gate) of one of the transistors 531 and 533 is connected to the output of the input stage 201 (through the node A), and control terminal (a gate) of the other of the transistors 531 and 533 is connected to the clock signal CLKN. For example, as shown in FIG. 2, the gate of the transistor 531 is connected to the output of the input stage 201 (through the node A), and the gate of the transistor 533 is connected to the clock signal CLKN. One end (here, the source) of the transistor 531 is connected to a power supply voltage VDD.

The drain of the PMOS transistor 533 and the drain of the NMOS transistor 535 are connected to each other and connected to the node B. The transistors 535 and 537 are connected in series with each other. One end (here, a source) of the transistor 535 is connected to one end (here, a drain)

of the transistor 537. A control terminal (a gate) of one of the transistors 535 and 537 is connected to the output of the input stage 201, and a control terminal (a gate) of the other of the transistors 535 and 537 is connected to the clock signal CLKP. For example, as shown in FIG. 2, the gate of the transistor 537 is connected to the output of the input stage 201 (through the node A), and the gate of the transistor 535 is connected to the clock signal CLKP. The other end (here, the source) of the transistor 537 is connected to a low-potential power supply (for example, a ground (GND)).

A person skilled in the art will easily understand that the tri-state logic used for implementing the intermediate stage 203 may be implemented in many ways, without being limited to the way shown in FIG. 2. For example, the tri-state logic may be implemented to include an inverter and a transmission gate instead, as will be described later with reference to FIG. 3A to FIG. 3B. In addition, in other embodiments, the signals received by the gates of the transistors 531 and 533 may be exchanged. Correspondingly, the signals received by the gates of the transistors 535 and 537 may be exchanged. That is, the gates of the transistors 531 and 537 may be configured to be connected to the clock signals CLKN and CLKP respectively, and the gates of the transistors 533 and 535 may be configured to be connected to the output of the input stage 201.

The output stage 205 receives the signal (voltage) at the node B as an input, and the output of the output stage serves as a flip-flop output Q. In this embodiment, the output stage is implemented as an inverter which includes CMOS transistors 511 and 513 connected in series with each other. The transistor 511 is a PMOS transistor, and the transistor 513 is an NMOS transistor. The control terminal (the gate) of the transistor 511 is connected to the node B, its source is connected to the power supply voltage VDD, and its drain is connected to the drain of the transistor 513 and connected to the output Q. The gate of the transistor 513 is connected to the node B, and its source is connected to the low-potential power supply (here, the ground (GND)).

The feedback stage 207 receives the flip-flop output Q as an input, and provides a feedback to the intermediate node B. Here, the feedback stage is implemented as a tri-state logic. In the embodiment shown in FIG. 2, the feedback stage 207 is implemented as a tri-state gate which assumes a logic-high state, a logic-low state, and a high-impedance state.

Specifically, as shown in FIG. 2, the tri-state gate of the feedback stage 207 is implemented by CMOS transistors. The tri-state gate includes: transistors 521 to 527 that are sequentially connected in series. The transistors 521, 523, 525, and 527 are herein referred to as first to fourth transistors respectively, and the above-mentioned transistors 531, 533, 535, and 537 are referred to as fifth to eighth transistors respectively. The first transistor 521 and the second transistor 523 are PMOS transistors, and the third transistor 525 and the fourth transistor 527 are NMOS transistors.

The first transistor 521 and the second transistor 523 are connected in series with each other. One end (here, a drain) of the transistor 521 is connected to one end (here, a source) of the transistor 523. A control terminal (a gate) of one of the first transistor 521 and the second transistor 523 is connected to the flip-flop output Q, and a control terminal of the other of the first transistor 521 and the second transistor 523 is connected to the clock signal CLKP. Here, in the embodiment shown in FIG. 2, the gate of the first transistor 521 is connected to the flip-flop output Q, and the gate of the second transistor 523 is connected to the clock signal CLKP. The other end (here, a source) of the transistor 521 is connected to the power supply voltage VDD. The drain of the PMOS transistor 523 and the drain of the NMOS transistor 525 are connected to each other and connected to the intermediate node B. The third transistor 525 and the fourth transistor 527 are connected in series with each other. One end (here, a source) of the transistor 525 is connected to one end (here, a drain) of the transistor 527. A control terminal (a gate) of one of the third transistor 525 and the fourth transistor 527 is connected to the flip-flop output Q, and a control terminal (a gate) of the other of the third transistor 525 and the fourth transistor 527 is connected to the clock signal CLKN. In the embodiment shown in FIG. 2, the gate of the fourth transistor 527 is connected to the flip-flop output Q, and the gate of the third transistor 525 is connected to the clock signal CLKN. The clock signal CLKN is the inverse of the clock signal CLKP. The other end (here, a source) of the transistor 527 is connected to the low-potential power supply (here, the ground GND).

A node at which the second transistor 523 and the third transistor 525 are connected with each other is connected to the intermediate node B. Here, the drain of the transistor 523 is connected to the drain of the transistor 525, and connected to the intermediate node B.

It should be understood that although in the embodiment shown in FIG. 2, the feedback stage 207 is implemented as a tri-state gate, the feedback stage 207 may be implemented in a variety of other ways in other embodiments.

In some embodiments, at least one of the input stage or the output stage is configured such that the logic toggling of the output of the D flip-flop is triggered by an edge of a clock signal.

Figure 7:
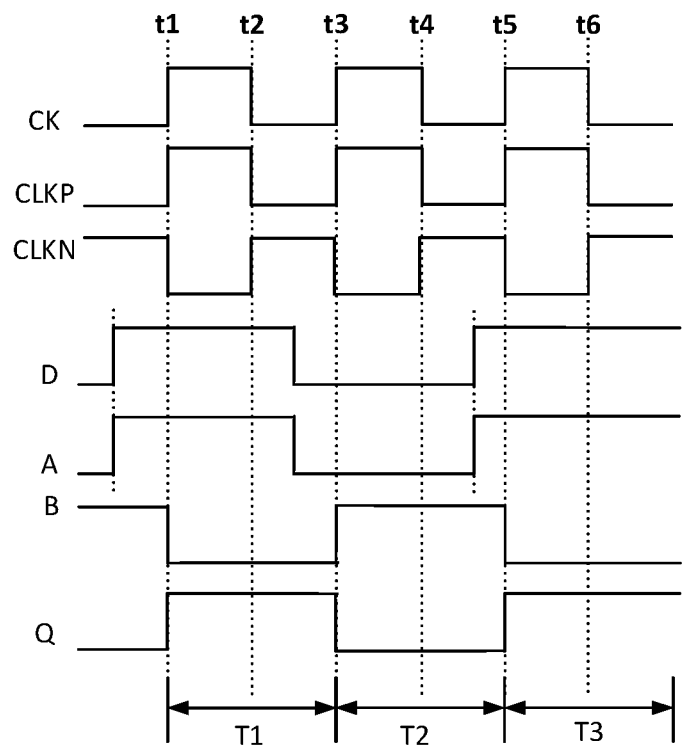
FIG. 7 shows a timing diagram of a schematic signal waveform of a D flip-flop according to some embodiments of the present disclosure.

The timing of the D flip-flop according to an embodiment of the present disclosure will be described below with reference to FIG. 7 and FIG. 2. FIG. 7 shows a timing diagram of a schematic signal waveform of a D flip-flop according to an embodiment of the present disclosure. The clock signals CLKN and CLKP may be obtained from a clock signal CK in a manner shown in FIG. 5, for example (to be detailed later). Without considering delay, the clock signal CLKP and the clock signal CLKN are inverted from each other, one of which may be basically identical to the clock signal CK. For example, here, the clock signal CLKP is basically identical to the clock signal CK, and the clock signal CLKN is the inverse of the clock signal CLKP (or the clock signal CK).

FIG. 7 shows two full clock cycles T1 and T2, a part of a clock cycle preceding T1, and at least a part of the cycle T3. As shown in FIG. 7, immediately before the start time t1 of the cycle T1: the clock signal CK is low; and correspondingly, the clock signal CLKN is high, and the clock signal CLKP is low: the input D is high, and the signal at the node A (hereinafter referred to as the signal A) is also high because the transmission gate is turned on. The clock signal CLKN is high and the clock signal CLKP is low; and therefore, the transistor 533 and the transistor 535 are turned off, the tri-state gate 203 is turned off, and the output Q is low when the node B is high: and the transistors 521 and 523 are turned on, the transistor 527 is turned off, and the feedback stage 207 is turned on, so that the signal at the node B (hereinafter referred to as the signal B) is latched and still high.

As shown in FIG. 7, at time t1, the clock signal CK changes from logic low to logic high (rising edge). Correspondingly, the clock signal CLKP changes from low to high (rising edge), and the clock signal CLKN changes from high to low (falling edge). At this time, the input D is high.

Because the clock signal CLKN is the inverse of the clock signal CLKP, the transmission gate 201 is turned off. Therefore, the signal at the node A (referred to as the signal A) is still high. At this time, the node A is in a potential-floating state.

At time t1, since the clock signal CLKN toggles to low; the clock signal CLKP toggles to high, and the node A is in a high state, the transistors 535 and 533 are turned on, and the signal B changes from high to low: The output stage 205 is an inverter, so that the output signal Q of the output stage changes from low to high. On the other hand, because the clock signal CLKN is low and the clock signal CLKP is high, the transistor 523 in the tri-state gate 207 is turned off and the transistor 525 is also turned off, thus the tri-state gate 207 is turned off and is in a high-impedance state.

At time t2 in a first cycle T1 of the clock CK, the clock signal CK is at a falling edge, the clock signals CLKN and CLKP toggle to high and low respectively, and B is low and Q is high. Therefore, the transistors 525 and 523 in the tri-state gate 207 are turned on, and in turn, the signal B is held low: In this way, the potential at the intermediate node B remains at an expected logic low potential.

The D flip-flop 200 is triggered by the edge of the clock signal, and here, the D flip-flop is triggered by the rising edge of the clock signal CK (correspondingly; the rising edge of the clock signal CLKP, the falling edge of the clock signal CLKN). Therefore, toggling of the logic states of the output Q and the intermediate node B (and/or other appropriate nodes) is no longer caused during the clock cycle starting from t1. During the clock cycle T1, the signal B is held low; so that the output Q is held high.

Subsequently, before the next cycle T2, the signal D changes from high to low: Because the transmission gate 201 is turned on, the signal A also changes from high to low accordingly. Before time t3, similar to the circumstance before time t1, the clock signal CK is low. Accordingly, the clock signal CLKN is high, and the clock signal CLKP is low. At this time, the input D is low: The clock signal CLKN is high and the clock signal CLKP is low, thus the transistors 533 and 535 are turned off, and the tri-state gate 203 is turned off. The signal B does not toggle along with the signal A, the signal B is still low; and the output Q is still high. At the same time, the transistors 525 and 523 are turned on, and the signal B is held low:

In the cycle T2, at time t3, a next rising edge of the clock signal CK arrives, the clock signal CLKP changes from low to high (rising edge) again, and the clock signal CLKN changes from high to low (falling edge) again. At this time, the signal D is low; the transmission gate 201 is turned off, and the signal A is held low. Therefore, in the intermediate stage 203, the transistors 535 and 533 are turned on, and in turn, the signal B toggles to high. Accordingly, the output Q of the transistor toggles to low:

However, in the feedback stage 207, because the clock signals CLKP and CLKN toggle to high and low respectively, the transistors 525 and 523 in the tri-state gate 207 are turned off. Therefore, the tri-state gate 207 is turned off and is in a high-impedance state.

Similarly, in the cycle T2, after the rising edge, the signals B and Q maintain their logic levels. At time t4, the falling edge of the clock signal CK arrives, and the clock signals CLKN and CLKP toggle accordingly while the signals B and Q maintain their logic levels. At this time, the clock signal CK is at the falling edge, the clock signals CLKN and CLKP toggle to high and low respectively, and Q is low: Therefore, the transistors 525 and 523 in the tri-state gate 207 are turned on, and in turn, the signal B is held high. In this way, the potential at the intermediate node B remains at an expected logic high potential.

Before the cycle T3 (the rising edge t5 thereof), the signal D changes from low to high, and accordingly, the signal A also changes from low to high. The circumstance at the rising edge time t5 is basically identical to the circumstance at the time t1, and the circumstance at the time t6 in the cycle T3 is basically identical to the circumstance at the time t2, details of which are omitted here.

In this way, the D flip-flop according to the embodiments of the present disclosure can stably maintain the potential of the floating node (such as node B), and reduce power consumption of the D flip-flop. In addition, because the potential of the floating node can be maintained, the use of high-threshold devices (such as high-threshold transistors) is avoided.

Here, a person skilled in the art will understand that, although the transistor devices in the D flip-flop are designed to have the same threshold, variations in the manufacturing process may lead to some deviations of the threshold of the devices that are practically manufactured. Generally, herein, thresholds are regarded as basically identical when the variations between the thresholds fall within ±20%, or ±15%, or ±10%, or ±5% of the designed or target threshold, for example.

In addition, the number of transistors used in the D flip-flop according to the embodiments of the present disclosure is minimized. In a calculation-intensive processor (for example, a processor used for digital currency), a large number of D flip-flops may exist. Therefore, even reduction of one transistor in the D flip-flop is still meaningful to reduction of the area and power consumption of the chip.

In addition, the D flip-flop according to the embodiments of the present disclosure can effectively maintain the potential of the floating node. Therefore, malfunction is avoided even when the D flip-flop works at a relatively low frequency. The D flip-flop is especially suitable for working at a low frequency with a small duty cycle (the duration for the high level is short and the duration for the low level is long). The D flip-flop according to the embodiments of the present disclosure can also work at a relatively high frequency, thereby providing flexibility for design of a processor and reducing power consumption.

It should be further understood that, although the above examples are described by using embodiments where the rising edge is active, other embodiments of the present disclosure can also be implemented in a manner where the falling edge is active. In this case, waveforms of the clock signals CLKN and CLKP will be inverted.

Figure 3A:
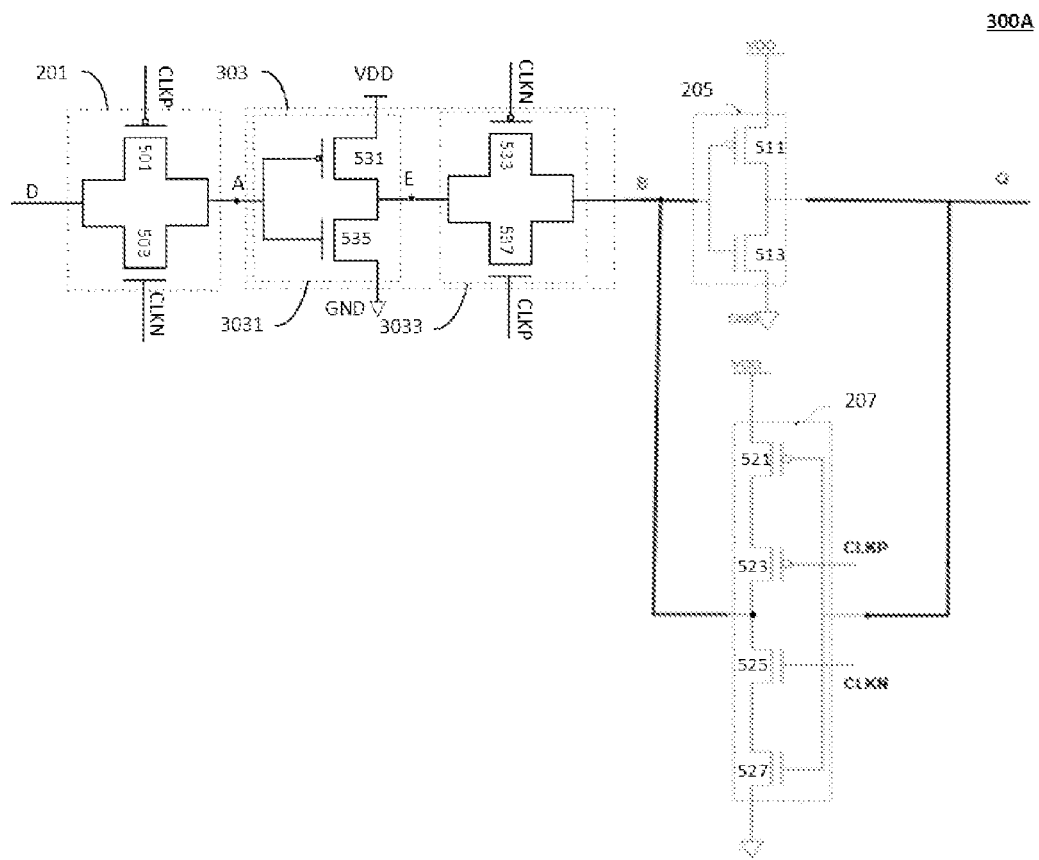
FIG. 3A shows a schematic circuit diagram of a D flip-flop according to some other embodiments of the present disclosure.

FIG. 3A is a schematic circuit diagram of a D flip-flop according to other some embodiments of the present application. The D flip-flop 300A shown in FIG. 3A differs from the D flip-flop 200 shown in FIG. 2 only in the intermediate stage. In the D flip-flop 300A, the tri-state logic of the intermediate stage 303 is implemented as an inverter 3031 and a transmission gate 3033 connected in series.

As shown in FIG. 3A, the CMOS transistors 531 and 535 constitute an inverter, and CMOS transistors 533 and 537 constitute a transmission gate. The input of the inverter 3031 is connected to the output (node A) of the input stage 201, and the output of the inverter 3031 is connected to the input (node E) of the transmission gate 3033. The output of the transmission gate 3033 is connected to the intermediate node (node B). Two control terminals of the transmission gate 3033 (that is, the gates of the CMOS transistors 533 and 537) receive the clock signal CLKN and the clock signal CLKP respectively. The clock signal CLKN and the clock signal CLKP are inverted from each other. That is, the clock signal CLKN and the clock signal CLKP are the inverse of each other.

The operation and logic level changes of the intermediate stage 303 are the same as those of the intermediate stage 203 shown in FIG. 2. Therefore, the operation and logic level changes described above with respect to the intermediate stage 203 may equally apply here. In addition, remaining components in FIG. 3A are identical to the corresponding components in FIG. 2, detailed descriptions of which are omitted here.

Figure 3B:
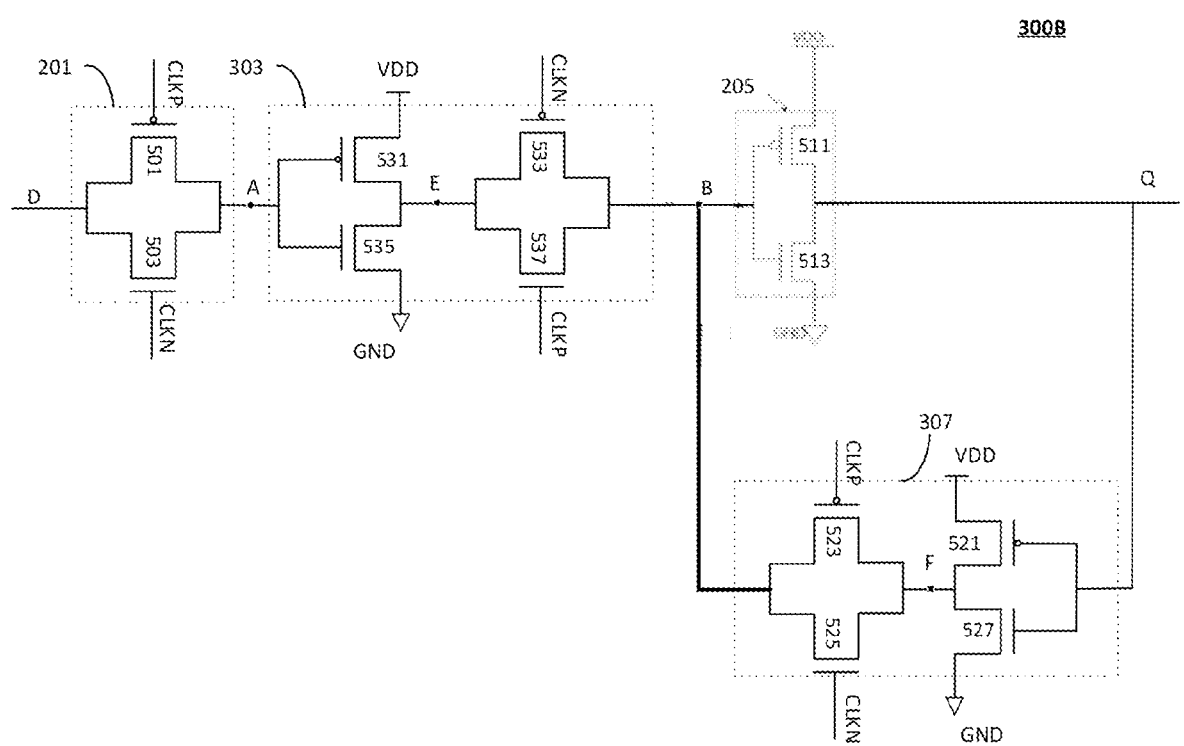
FIG. 3B shows a schematic circuit diagram of a D flip-flop according to some other embodiments of the present disclosure.

FIG. 3B is a schematic circuit diagram of a D flip-flop according to other some embodiment of the present disclosure. The D flip-flop 300B shown in FIG. 3B differs from the D flip-flop 300A shown in FIG. 3A only in the feedback stage. In the D flip-flop 300B, the tri-state logic of the feedback stage 307 is implemented as an inverter and a transmission gate connected in series.

As shown in FIG. 3B, the CMOS transistors 521 and 527 constitute an inverter, and CMOS transistors 523 and 525 constitute a transmission gate. The input of the inverter is connected to the flip-flop output node (Q), and the output of the inverter is connected to the input (node F) of the transmission gate. The output of the transmission gate is connected to the intermediate node (node B). Two control terminals of the transmission gate (that is, the gates of the CMOS transistors 523 and 525) receive the clock signal CLKP and the clock signal CLKN respectively.

In the embodiment shown in FIG. 3B, the node F may be used as an output to output the inverse QN of the flip-flop output Q.

In addition, a person skilled in the art would easily understand that different implementations of the input stage, the intermediate stage, and the feedback stage in the embodiments of the present disclosure may be combined arbitrarily when appropriate. For example, one or more of the input stage, the intermediate stage, and the feedback stage may be implemented as a tri-state gate or implemented as a combination of the inverter and the transmission gate.

The D flip-flop according to the embodiments of the present disclosure is a semi-static flip-flop, the output stage, the feedback stage, and the intermediate node B of which constitute a latch so as to statically maintain the potential or logic level at the node B, but the potential of some nodes (such as node A) is not maintained or latched. In some implementations, a second intermediate stage may further exist between the intermediate node and the output stage, which second intermediate stage may be various logic gates or logic circuits.

On the other hand, as mentioned above, in order to reduce or avoid the impact caused by device current leakage to voltage of a node (such as node B), a circuit device connected to the node needs to be a low-current-leakage device. The low-current-leakage device is usually a high-threshold device with a lower speed than a low-threshold device, thereby also influencing the speed of the D flip-flop. Meanwhile, the D flip-flop needs to work at a relatively high frequency to prevent malfunction. In some states (for example, sleep or idle state) of a processor, the D flip-flop may work at a relatively low frequency, and in this case, the D flip-flop in the related art may incur malfunction. However, due to the semi-static configuration of the D flip-flop according to the embodiments of the present disclosure, the thresholds of the transistors in the D flip-flop may be configured to be basically identical, thereby avoiding the use of high-threshold devices. This increases the speed of the D flip-flop and the D flip-flop can work normally without malfunctioning even at a relatively low frequency.

Figure 4:
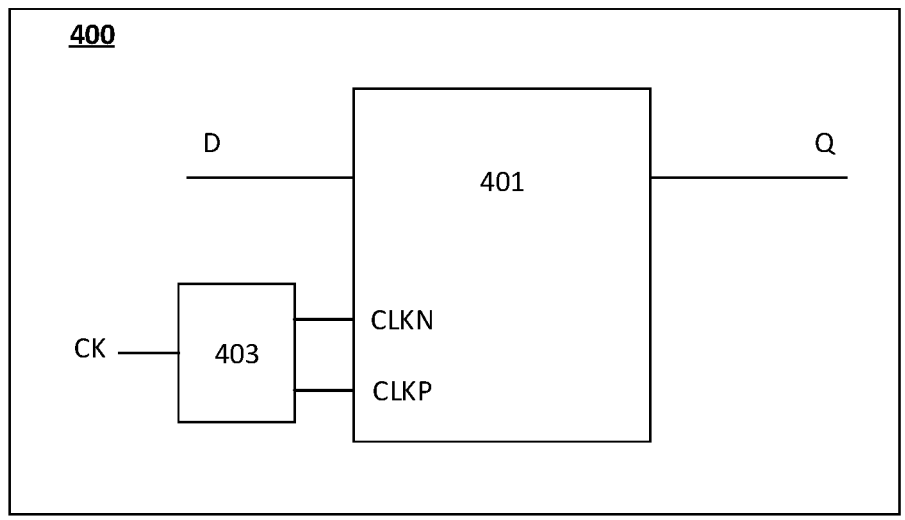
FIG. 4 shows a schematic block diagram of a processor that includes a clock circuit and a D flip-flop according to some embodiments of the present disclosure.

According to the present disclosure, a processor is further provided. FIG. 4 is a schematic block diagram of a processor that includes a clock circuit and a D flip-flop according to some embodiments of the present disclosure. As shown in FIG. 4, the processor 400 includes at least one D flip-flop 401. The D flip-flop may be the D flip-flop according to any one of the embodiments of the present disclosure. The processor 400 may further include a clock circuit 403 configured to provide a desired clock signal to each D flip-flop. As shown in FIG. 4, the clock circuit 403 receives a clock signal CK (which may be a system clock signal, or a clock signal received from outside), and outputs different clock signals CLKN and CLKP. As mentioned above, in some embodiments, the clock signals CLKN and CLKP are opposite in phase.

Figure 5:
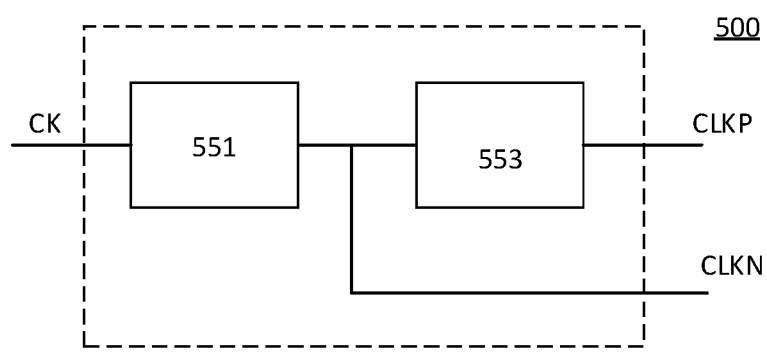
FIG. 5 shows a schematic block diagram of a clock circuit according to some embodiments of the present disclosure.

FIG. 5 is a schematic block diagram of a clock circuit according to some embodiments of the present disclosure. The clock circuit 500 includes a first inverter 551 and a second inverter 553 connected in series. The first inverter 551 receives a clock signal (for example, a system clock) CK and outputs a first clock signal (for example, the clock signal CLKN or CLKP). The second inverter receives the first clock signal and outputs a second clock signal (for example, the clock signal CLKP or CLKN). In this way, the first clock signal and the second clock signal are inverted from each other. The first clock signal and the second clock signal may be provided to one or more of the plurality of D flip-flops.

Figure 6:
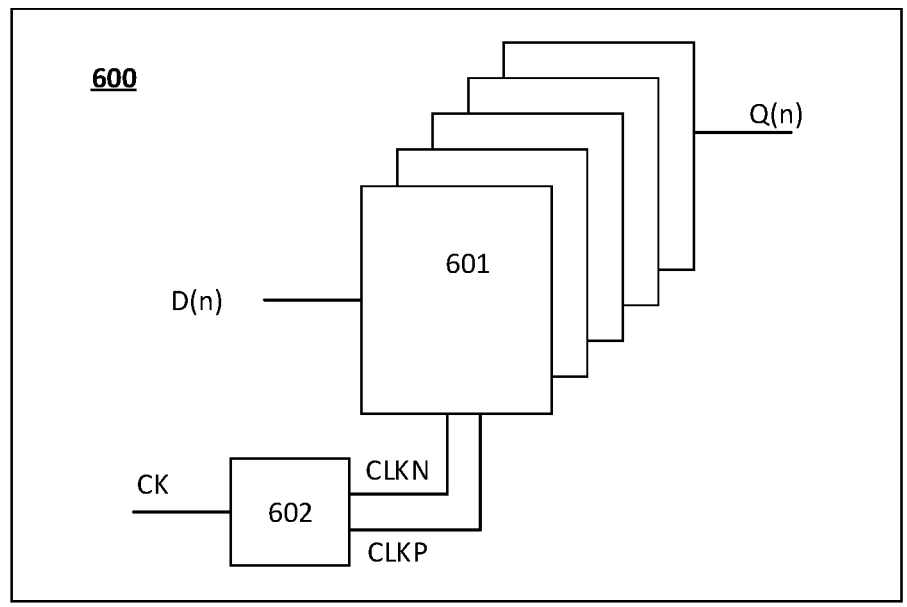
FIG. 6 shows a schematic block diagram of a processor that includes a clock circuit and a plurality of D flip-flops according to some embodiments of the present disclosure.

FIG. 6 is a schematic block diagram of a processor that includes a clock circuit and a plurality of D flip-flops according to some embodiments of the present disclosure. As shown in FIG. 6, the processor 600 includes a plurality of D flip-flops 601 and a clock circuit 602 that provides clock signals to the plurality of D flip-flops 601. The clock circuit 602 receives the clock CK and outputs clock signals CLKN and CLKP to each D flip-flop 601. The clock circuit 602 may be, for example, the clock circuit shown in FIG. 4.

According to the present disclosure, a computing apparatus is further provided. The computing apparatus may include the processor according to any one of embodiments of the present disclosure. In some embodiments, the computing apparatus may be a computing apparatus for digital currency: The digital currency may be, for example, digital RMB, Bitcoin, Ethereum, Litecoin, or the like.

A person skilled in the art should appreciate that the boundaries between the operations (or steps) described in the above embodiments are merely illustrative. A plurality of operations may be combined into a single operation, and a single operation may be distributed among additional operations, and the operations may be performed in time periods that at least partly overlap. Moreover, alternative embodiments may include a plurality of instances of particular operations, and the order of operations may be changed in other various embodiments. However, other modifications, changes, and substitutions are also possible. Therefore, this specification and the drawings appended hereto are intended as illustrative rather than restrictive.

Although the present disclosure has been described in detail with regard to some specific embodiments by using examples, a person skilled in the art shall understand that the examples are merely intended to be illustrative rather than restrict the scope of the present disclosure. The embodiments disclosed herein may be combined arbitrarily without departing from the spirit and scope of the present disclosure. A person skilled in the art shall also understand that various modifications may be made to the embodiments without departing from the spirit and scope of the present disclosure. The scope of the present disclosure is defined by the claims appended hereto.

The invention claimed is:

1. A D flip-flop comprising:
an input stage configured to receive a flip-flop input;
an output stage configured to output a flip-flop output;
an intermediate node disposed between an output of the input stage and an input of the output stage, wherein the output stage is configured to receive a signal at the intermediate node as an input;
an intermediate stage configured to receive an output of the input stage and provide the output to the intermediate node; and
a feedback stage configured to receive the flip-flop output and provide a feedback to the intermediate node,
wherein the feedback stage assumes a logic-high state, a logic-low state, and a high-impedance state,
wherein a potential at the intermediate node is maintained such that a use of a high-threshold transistor as a transistor connected to the intermediate node is avoided in the D flip-flop, and a threshold of the transistor connected to the intermediate node in the D flip-flop is substantially identical to thresholds of all other transistors in the D flip-flop.

2. The D flip-flop according to claim 1, wherein the feedback stage comprises a tri-state gate that comprises:
first to fourth transistors that are sequentially connected in series, wherein the first transistor and the second transistor are transistors of a first conductivity type, the third transistor and the fourth transistor are transistors of a second conductivity type that is different from the first conductivity type,
a control terminal of one of the first transistor and the second transistor is configured to be connected to the flip-flop output, and a control terminal of the other of the first transistor and the second transistor is configured to be connected to a first clock signal,
a control terminal of one of the third transistor and the fourth transistor is configured to be connected to the flip-flop output, and a control terminal of the other of the third transistor and the fourth transistor is configured to be connected to a second clock signal, wherein the second clock signal is an inverse of the first clock signal,
a node at which the second transistor and the third transistor are connected with each other is configured to be connected to the intermediate node.

3. The D flip-flop according to claim 1, wherein the feedback stage comprises an inverter and a transmission gate connected in series,
the inverter comprises a first transistor of a first conductivity type and a fourth transistor of a second conductivity type that are connected in series, the transmission gate comprises a second transistor of the first conductivity type and a third transistor of the second conductivity type that are connected in parallel, the second conductivity type is different from the first conductivity type,
an input of the inverter is configured to be connected to the flip-flop output, an output of the inverter is configured to be connected to an input of the transmission gate, an output of the transmission gate is configured to be connected to the intermediate node,
two control terminals of the transmission gate are configured to receive a first clock signal and a second clock signal respectively, wherein the second clock signal is an inverse of the first clock signal.

4. The D flip-flop according to claim 2, wherein:
the first conductivity type is P-type, and the second conductivity type is N-type,
when the first clock signal is high and the second clock signal is low, the feedback stage is configured to be turned off to assume the high-impedance state;
when the first clock signal is low and the second clock signal is high, the feedback stage is configured to provide a feedback to the intermediate node based on the flip-flop output.

5. The D flip-flop according to claim 1, wherein the input stage comprises a transmission gate.

6. The D flip-flop according to claim 2, wherein the intermediate stage is a tri-state logic configured to receive the output of the input stage as well as the first clock signal and the second clock signal, the tri-state logic is configured to assume the logic-high state, the logic-low state, and the high-impedance state based on the output of the input stage, the first clock signal, and the second clock signal.

7. The D flip-flop according to claim 6, wherein
the tri-state logic comprises an inverter and a transmission gate, the inverter is configured to receive the output of the input stage as an input, an output of the inverter is configured to be connected to one end of the transmission gate, another end of the transmission gate is configured to be connected to the intermediate node, and control terminals of the transmission gate are configured to receive the first clock signal and the second clock signal respectively.

8. The D flip-flop according to claim 6, wherein the tri-state logic comprises a tri-state gate that comprises:
fifth to eighth transistors that are sequentially connected in series, wherein the fifth transistor and the sixth transistor are transistors of the first conductivity type, and the seventh transistor and the eighth transistor are transistors of the second conductivity type,
a control terminal of one of the fifth transistor and the sixth transistor is configured to be connected to the output of the input stage, and a control terminal of the other of the fifth transistor and the sixth transistor is configured to be connected to the second clock signal,
a control terminal of one of the seventh transistor and the eighth transistor is configured to be connected to the output of the input stage, and a control terminal of the other of the seventh transistor and the eighth transistor is configured to be connected to the first clock signal,
a node at which the sixth transistor and the seventh transistor are connected with each other is configured to be connected to the intermediate node.

9. The D flip-flop according to claim 1, wherein the D flip-flop is a semi-static flip-flop, and the output stage, the feedback stage, and the intermediate node constitute a latch.

10. The D flip-flop according to claim 7, wherein the first conductivity type is P-type, and the second conductivity type is N-type,
when the first clock signal is high and the second clock signal is low, the first intermediate stage is configured to provide an output to the intermediate node based on the output of the input stage;
when the first clock signal is low and the second clock signal is high, the first intermediate stage is configured to be turned off to assume a high-impedance state.

11. The D flip-flop according to claim 1, wherein logic toggling of an output of at least one of the input stage or the intermediate stage is triggered by an edge of a clock signal.

12. A processor comprising:
  at least one D flip-flop, wherein the D flip-flop is the D flip-flop according to claim 1.

13. The processor according to claim 12, wherein the at least one D flip-flop comprises a plurality of D flip-flops; and the processor further comprises:
  a clock circuit configured to provide a desired clock signal to each of the plurality of D flip-flops.

14. The processor according to claim 13, wherein the clock circuit comprises a first inverter and a second inverter connected in series, the first inverter is configured to receive a clock signal and output a first clock signal, and the second inverter is configured to receive the first clock signal and output a second clock signal,
  the first clock signal and the second clock signal are provided to each of the plurality of D flip-flops.

15. A computing apparatus comprising the processor according to claim 12.

16. The computing apparatus according to claim 15, wherein the computing apparatus is a computing apparatus for digital currency.

17. The D flip-flop according to claim 3, wherein:
  the first conductivity type is P-type, and the second conductivity type is N-type,
  when the first clock signal is high and the second clock signal is low, the feedback stage is configured to be turned off to assume the high-impedance state;
  when the first clock signal is low and the second clock signal is high, the feedback stage is configured to provide a feedback to the intermediate node based on the flip-flop output.

18. The D flip-flop according to claim 3, wherein the intermediate stage is a tri-state logic configured to receive the output of the input stage as well as the first clock signal and the second clock signal, the tri-state logic is configured to assume the logic-high state, the logic-low state, and the high-impedance state based on the output of the input stage, the first clock signal, and the second clock signal.

19. The D flip-flop according to claim 8, wherein the first conductivity type is P-type, and the second conductivity type is N-type,
  when the first clock signal is high and the second clock signal is low, the first intermediate stage is configured to provide an output to the intermediate node based on the output of the input stage;
  when the first clock signal is low and the second clock signal is high, the first intermediate stage is configured to be turned off to assume a high-impedance state.

* * * * *